United States Patent [19]

Oku

[11] Patent Number: 5,376,812
[45] Date of Patent: Dec. 27, 1994

[54] SEMICONDUCTOR DEVICE

[75] Inventor: Tomoki Oku, Itami, Japan

[73] Assignee: Mitsubishi Denki Kabushiki Kaisha, Tokyo, Japan

[21] Appl. No.: 453,762

[22] Filed: Dec. 20, 1989

[30] Foreign Application Priority Data

Apr. 12, 1989 [JP] Japan ..................... 1-93577

[51] Int. Cl.$^5$ .................... H01L 29/80; H01L 21/265
[52] U.S. Cl. .................... 257/279; 257/280; 257/282; 257/285; 257/286; 257/287
[58] Field of Search ................ 357/15; 257/279, 280, 257/282, 285, 286, 287

[56] References Cited

U.S. PATENT DOCUMENTS

| 4,356,623 | 7/1989 | Hunter | 437/44 |
|---|---|---|---|
| 4,546,540 | 10/1985 | Ueyanagi et al. | 357/15 |
| 4,586,063 | 4/1986 | Nakamura et al. | 357/15 |
| 4,628,338 | 12/1986 | Nakayama et al. | 357/15 |
| 4,636,822 | 1/1987 | Codella et al. | 357/15 |
| 4,803,526 | 2/1989 | Terada et al. | 357/15 |
| 4,863,879 | 9/1989 | Kwok | 357/15 |
| 4,962,054 | 10/1990 | Shikata | 437/40 |

FOREIGN PATENT DOCUMENTS

| 0152615 | 8/1985 | European Pat. Off. . |
|---|---|---|
| 0160255 | 11/1985 | European Pat. Off. . |
| 1028870 | 1/1989 | European Pat. Off. . |
| 0306039 | 3/1989 | European Pat. Off. . |
| 337299 | 4/1989 | European Pat. Off. . |
| 6254966 | 9/1985 | Japan . |
| 60-211985 | 10/1985 | Japan . |
| 61-82481 | 4/1986 | Japan . |
| 63-107071 | 5/1988 | Japan . |
| 63-120471 | 5/1988 | Japan . |
| 63-173375 | 7/1988 | Japan . |
| 63-273362 | 11/1988 | Japan . |
| 63-273382 | 11/1988 | Japan . |
| 63-308363 | 12/1988 | Japan | 357/15 |
| 1-12579 | 1/1989 | Japan | 357/15 |
| 64-12579 | 1/1989 | Japan . |
| 1-31470 | 2/1989 | Japan . |
| 144069 | 2/1989 | Japan . |
| 1-64358 | 3/1989 | Japan | 357/15 |
| 1-136365 | 5/1989 | Japan | 357/15 |
| 1136365 | 5/1989 | Japan . |

OTHER PUBLICATIONS

Geissberger et al., "A New Refractory . . . MMIC's," IEEE Transactions on Electron Devices, vol. 35, No. 5, May 1988, pp. 615–622.

Primary Examiner—Viet Q. Nguyen
Attorney, Agent, or Firm—Leydig, Voit & Mayer

[57] ABSTRACT

A method for producing a Schottky barrier gate type field effect transistor includes producing a low concentration active region at a desired position of a semi-insulating compound semiconductor substrate and producing a gate electrode comprising refractory metal on the active region, producing a first insulating film and etching the same thereby to produce first side wall assist films comprising the first insulating film at both side walls of the gate electrode, removing one of the first side wall assist films at the side where a source electrode is to be produced, depositing a second insulating film to the thickness less than that of the first insulating film, etching the second insulating film thereby to produce a second side wall assist film having narrower width than that of the first side wall assist film at the side wall of the gate electrode where the source electrode is to be produced, and conducting ion implantation using the first and second side wall assist films and the gate electrode as a mask thereby to produce high concentration active regions in asymmetrical configurations at sides of the gate electrode.

2 Claims, 9 Drawing Sheets

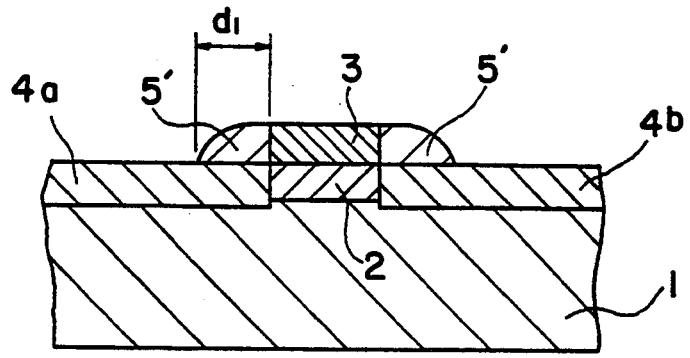
FIG. I(d)
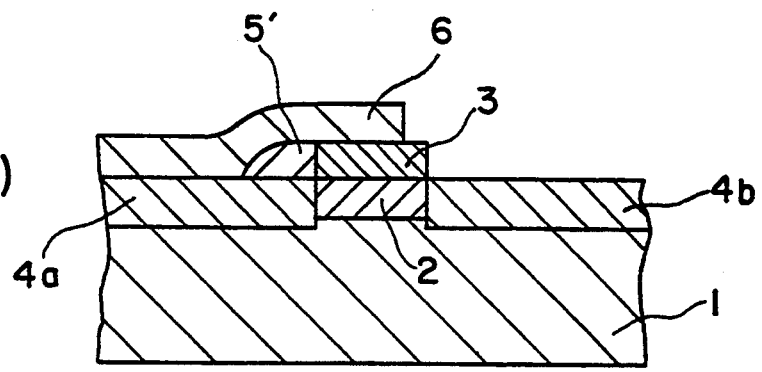
FIG. I(e)
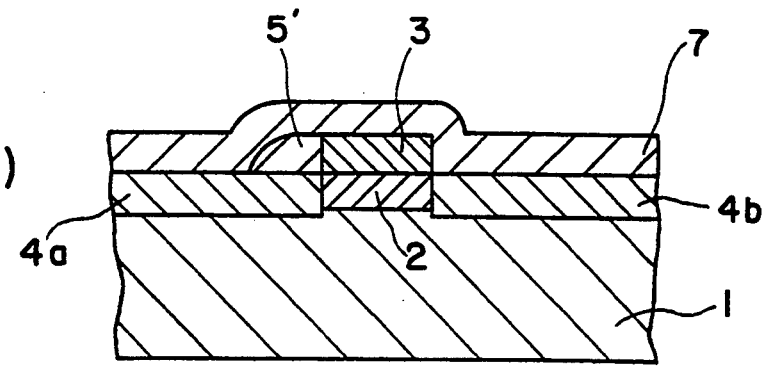
FIG. I(f)

F I G .3.
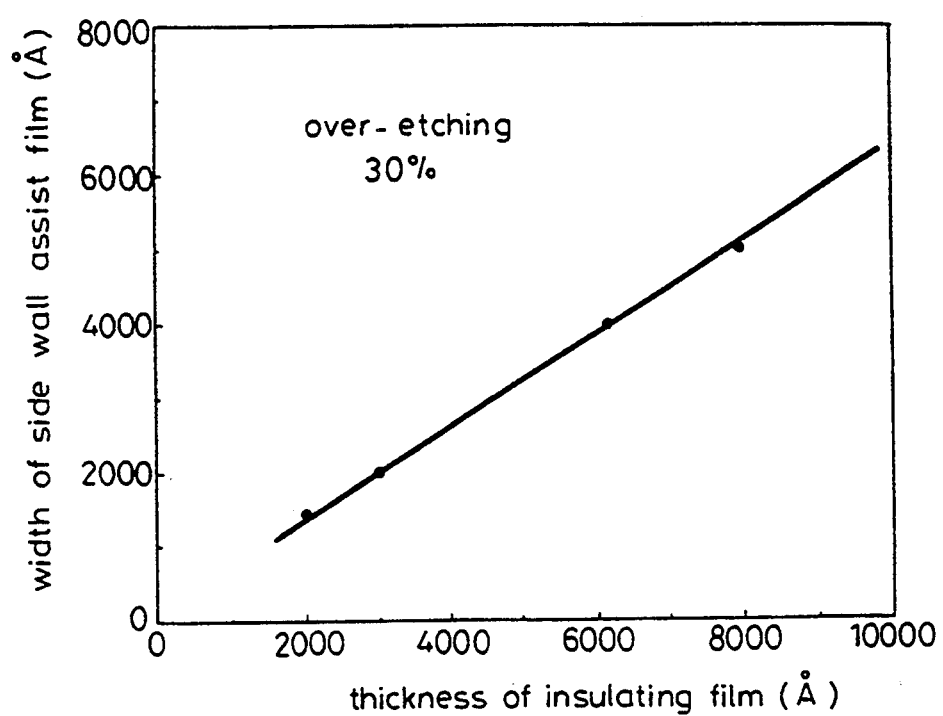

SEMICONDUCTOR DEVICE

FIELD OF THE INVENTION

The present invention relates to a semiconductor device and a production method therefor and, more particularly, to a Schottky barrier gate type field effect transistor utilizing a high dopant concentration active layer which is asymmetrical with respect to the gate and is self-aligned.

BACKGROUND OF THE INVENTION

FIGS. 4(a) to 4(d) are cross-sectional side views showing major process steps for producing a semiconductor device according to the prior art. In the figures, reference numeral 1 designates a semi-insulating GaAs substrate. An n type active layer 2 is disposed in the semi-insulating GaAs substrate 1. A gate electrode 3 comprising refractory metal is disposed on the active layer 2. N' type intermediate dopant concentration active layers (hereinafter referred to as "n' layer") 4a (4a') and 4b are disposed adjacent the n type active layer 2. N+type high dopant concentration active layers n(hereinafter referred to as "n+ layer") 8a and 8b are disposed adjacent the n' layer 4a' and the n type active layer 2, respectively. A source electrode 9 and a drain electrode 10 are disposed on the n+ layers 8a and 8b, respectively. Reference numeral 6 designates photoresist.

The production method will be described.

First of all, as shown in FIG. 4(a), an n type active layer 2 is produced in a semi-insulating GaAs substrate 1 by ion implantation or epitaxial growth. Thereafter, a refractory metal is plated on the entire surface of wafer and patterned by reactive ion etching using photoresist as a mask, thereby to produce a refractory metal gate electrode 3.

Next, as shown in FIG. 4(b), dopant ions are implanted using the refractory metal gate electrode 3 as a mask, whereby n' layers 4a and 4b are produced at both sides of the gate electrode 3.

Next, as shown in FIG. 4(c), photoresist is deposited on the entire surface of substrate and patterned in an asymmetrical configuration with respect to the refractory metal gate electrode 3, and dopant ions are implanted using the patterned photoresist 6 as a mask, whereby n+ layers 8a and 8b are produced at asymmetrical positions with respect to the gate electrode 3.

After, an annealing process, as shown in FIG. 4(d), a drain electrode 10 is deposited on the n+ layer 8a at the side where the n' layer 4a' remain and a source electrode 9 is deposited on the n+ layer 8b at the opposite side of the gate electrode 3 by vapor deposition and lift-off, thereby completing a field effect transistor.

In the above-described production method, however, the ion implantation for producing the n+ layers 8a and 8b to use the photoresist 6 as a mask, and the distance between the gate electrode 3 and the n+ layer 8a is determined by the precision of patterning the photoresist. Therefore, in the field effect transistor obtained by the above-described production method, there is a large variation in the gate-drain breakdown voltage and variation in the performance of the transistor. Furthermore, since the distance between the gate electrode 3 and the n+ layer 8b at the side of source electrode 9 is zero, a sufficient breakdown voltage cannot be obtained.

Another prior art production method will be described.

FIGS. 5(a) to 5(e) are cross-sectional side views showing major process steps for producing a semiconductor device disclosed in Japanese Published Patent Application 63-107071. In the figures reference numeral 21 designates a semiconductor substrate. An active region 22 is disposed on the semiconductor substrate 21. A gate electrode 23 is disposed on the active region 22. A first insulating film 24 (24', 24") is disposed on the active region 22. Reference numeral 25 designates photoresist. Reference numeral 26 (26') designates a second insulating film. Reference numeral 27 designates a contact region.

The production method will be described.

First of all, as shown in FIG. 5(a), an active region 22 and a gate 23 are produced on the GaAs substrate 21, and thereafter, a first insulating film 24 having a thickness $t_1$ is deposited thereon. Thereafter, photoresist is deposited on the entire surface, exposed, and developed thereby to obtain a photoresist 25 having a configuration as shown in FIG. 5(b). Subsequently, as shown in FIG. 5(c), a portion of the oxide film 24 is removed by a dilute solution of hydro-fluoric acid using the photoresist 25 as a mask. Thereafter, as shown in FIG. 5(d), after removing the photoresist 25, a second insulating film 26 having thickness $t_2$ is deposited on the entire surface. Then, as shown in FIG. 5(e), the entire surface is selectively etched to produce asymmetric configuration side walls 24" and 26' at respective sides of the gate 23', contact regions 27 are produced by ion beam implantation with using the side walls 24', 26' and the gate 23 as a mask. The contact regions 27 are asymmetric with respect to the gate 23 yet self-aligning due to the difference between the thickness of the side wall 24" and that of the side wall 26'.

In such field effect transistor, a predetermined distances are provided between the gate 23 and the respective contact layers 27, and therefore, high gate-drain breakdown voltage can be obtained and current leakage between the gate and the source side contact layer 27 is prevented.

In the prior art production method of a semiconductor device, however, the following problems arise in the actual production steps.

There is no anisotropicity in the wet etching of removing the insulating film 24 at the gate side using the photoresist 25 as a mask, as shown in FIG. 6. The photoresist 25 is attached at the side, removing some of the first insulating film 24' below the photoresist 25. Even if this etching is dry etching, the etching selectivity of the first insulating film 24 relative to the gate 23 and GaAs substrate 2 is about 1:10, and it is difficult to remove only the first insulating film 24 by the etching. Therefore, as shown in FIG. 7, the surface of substrate and the side wall of gate 23 are also etched and damaged at the same time, causing arising variations in the gate length and reductions in the thickness of the active layer 22 in the substrate 21. This results in variations and deteriorations in the FET performance.

Secondly, in the process of producing side wall insulating films 24" and 26' which are asymmetrical with respect to the gate 23 by reactive ion etching (RIE), the film thicknesses, and $t_2$ of the insulating films are different to the left and right of the gate 23 as shown in FIG. 8(a), and the time is required for equal etching is differentiate. Therefore, as shown in FIG. 8(b), when the insulating film 26' is produced at the side wall of the gate 23, the first insulating film 24' still remains on the active layer 22 and on a portion of the gate 23. Accordingly, if the insulating film 24' is further etched until a side wall insulating film 24" comprising the first insulating film 24' of a desired configuration is produced, the side wall insulating film 26' comprising the second insulating film which has already been produced is almost totally removed. Thus, a desired side wall insulating film having an asymmetrical configuration will not be obtained, thereby increasing the variation of the gate-drain breakdown voltage. Furthermore, there are current leakages between the gate and source region, thereby deteriorating the FET performance. Furthermore, in this process, the active layer 22 and the gate 23 at the side where the side wall insulating film 26' is produced are damaged by etching, thereby deteriorating the FET performance to a great extent.

SUMMARY OF THE INVENTION

It is an object of the present invention to provide a semiconductor device including a refractory metal self-aligned transistor, reducing variations in the gate-drain breakdown voltage and in transistor performances, and obtaining a sufficient gate-source breakdown voltage with high precision and reproducibility.

Another object of the present invention is to provide a method for producing such a semiconductor device.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, a semiconductor device is provided with a gate electrode comprising a refractory metal provided on a semi-insulating compound semiconductor substrate where a low dopant concentration active layer is disposed, side wall assist films in asymmetrical configurations at the respective side walls of the gage electrode, and high dopant concentration active regions disposed asymmetrically with respect to gate. Therefore, the variations in the transistor performance such as the drain-gate breakdown voltage and source-gate breakdown voltage are reduced, and a high efficiency self-aligned field effect transistor is obtained with high precision.

According to another aspect of the present invention, in the semiconductor device of above-described configuration, an intermediate dopant concentration active region is disposed at below the side wall assist films, and a high dopant concentration active region is disposed adjacent the intermediate dopant concentration active region, thereby producing an LDD structure. Therefore, the variations in the draingate voltage are further reduced, and furthermore, the short channel effect is prevented.

According to a still another aspect of the present invention, a production method of a semiconductor device includes process steps of producing a gate electrode comprising a refractory metal on a low dopant concentration active region in a semi-insulating compound semiconductor substrate, depositing a first insulating film and entirely etching the first insulating film thereby to leave first side wall assist films at both sides of gate electrode, removing the first side wall assist film at the side of gate electrode where a source electrode is to be produced using a photosensitive resin as a mask and wet etching, depositing a second insulating film having a smaller thickness than that of the first insulating film, producing a second side wall film having a narrower width than that of the first side wall film at the side wall of the gate electrode where a source electrode is to be produced by etching the entire surface and implanting dopant ions using the first and second side wall assist films and the gate electrode as a mask, thereby producing high dopant concentration active regions having asymmetrical configurations at the respective sides of the gate electrode. Therefore, the first and second side wall assist films can be produced at the side walls of the gate electrode with controllability and high reproducibility.

According to a still another aspect of the present invention, the above-described production method for a semiconductor device further includes producing intermediate dopant concentration active layers at both sides of the gate electrode by dopant ion implantation using the gate electrode as a mask, after producing the gate electrode on the low dopant concentration active region and before depositing the first insulating film.

BRIEF DESCRIPTION OF THE DRAWINGS

FIGS. 1(a) to 1(i) are cross-sectional side views of the major process steps of a production method for a semiconductor device according to a first embodiment of the present invention;

FIG. 3 is a diagram showing a method of controlling the distance between the gate and n+ type high dopant concentration active layer and the stability thereof in the first embodiment;

DETAILED DESCRIPTION OF THE PREFERRED EMBODIMENT

Figure 1A:
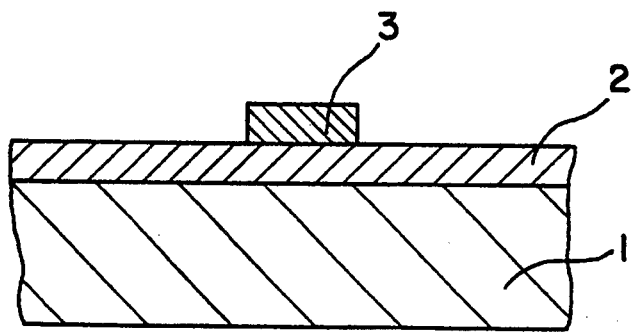

An embodiment of the present invention will be described in detail with reference to the drawings.

FIGS. 1(a) to 1(i) show cross-sectional side views of the major process steps of a production method for a semiconductor device according to a first embodiment of the present invention. In FIG. 1, the same reference numerals designate the same or corresponding elements as those shown in FIG. 4(a) to 4(d). Reference numerals 4a and 4b (4a' and 4b') designate n' type intermediate dopant concentration active layers. Reference numeral 5 (5') designates a first insulating film. Reference numeral 7 (7') designates a second insulating film.

The production process will be described.

First of all, as shown in FIG. 1(a), an n type active layer 2 of 1000 to 2000 angstroms thickness is produced by implanting dopant ions into a semi-insulating GaAs substrate 1 using $^{29}Si^+$ ions, at a implantation energy of 50 KeV, and impurity concentration of $1 \times 10^{12} cm^{-2}$ or by epitaxial growth. Thereafter, a refractory metal such as $WSi_x$ is deposited on the entire surface the substrate to a thickness of 3000 angstroms by sputtering. The metal is patterned by reactive ion etching using photoresist as a mask, thereby producing Schottky barrier a refractory metal gate 3 of about 1 micron gate length.

Figure 1B:
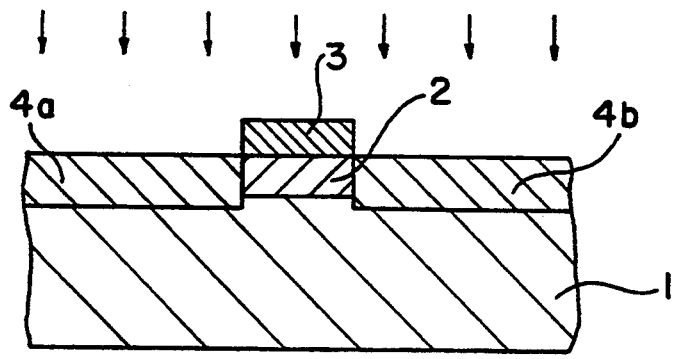

Next, as shown in FIG. 1(b), $^{29}Si^+$ ions are implanted at an implantation energy of 50 KeV and impurity concentration of $1\times10^{12}$ cm$^{-2}$ using the refractory metal gate 3 as a mask, thereby producing n' type active layers 4a and 4b at the respective sides of the gate 3.

Figure 1C:
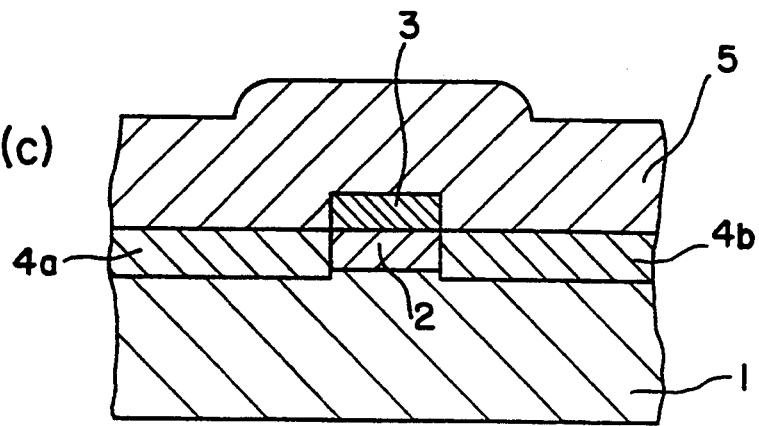

Next, as shown in FIG. 1(c), a first insulating film 5 comprising $SiO_x$ (x=1 to 2) is deposited to a thickness of 8000 to 10000 angstroms by plasma CVD using a mixture of $SiH_4$ and $N_2O$.

Furthermore, as shown in FIG. 1(d), the entire surface of the wafer is etched by reactive ion etching using a mixture of $C_2F_6$, $CF_4$, $CHF_3$ and $O_2$, and further. Over-etching is conducted exceeding the etching conclusion point to a degree of about 10 to 30%, thereby producing side wall assist films 5' of about 5000 angstroms width comprising the first insulating film 5, at both side walls of the gate 3.

Next, as shown in FIG. 1(e), photoresist 6 is deposited and patterned to mask the side wall assist film 5' at the side where a drain electrode is to be produced. The side wall assist film 5' at the side where a source electrode is to be produced is removed by a buffered hydrofluoric acid etch ($HF+NH_4F+H_2O$) using the photoresist 6 as a mask.

Thereafter, as shown in FIG. 1(f), the photoresist 6 is removed in an $O_2$ asher or organic series solution. The second insulating film 7 comprising $SiO_x$ (x=1 to 2) is deposited on the entire surface of substrate to a thickness of about 3000 angstroms by plasma CVD using a mixture of $SiH_4$ and $N_2O$.

Figure 1G:
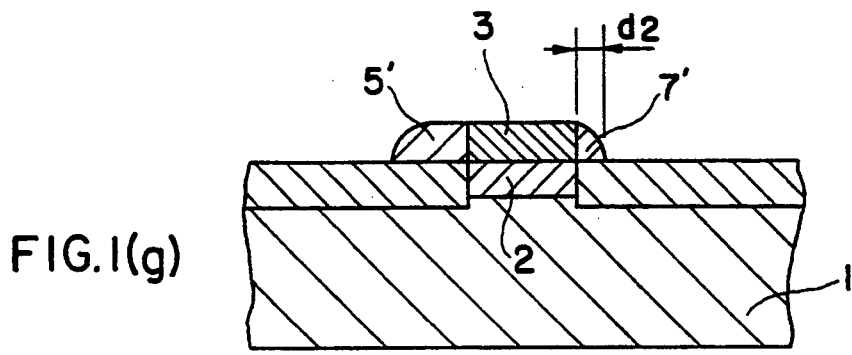

Furthermore, as shown in FIG. 1(g), the entire surface of the wafer is over-etched exceeding the etching conclusion point to a degree of 10 to 30% by reactive ion etching using a mixture of $C_2F_6$, $CF_4$, $CHF_3$, and $O_2$. The side wall assist film 5' of about 5000 angstroms width comprising the first insulating film 5 and the side wall assist film 7' of about 2000 angstroms width comprising a second insulating film 7 are produced at the side walls of the gate 3.

Figure 1H:
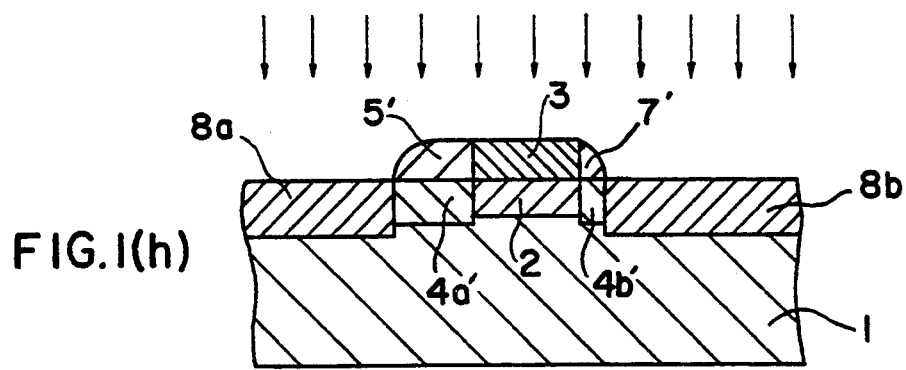

Next, as shown in FIG. 1(h), $^{29}Si^+$ ions are implanted into the substrate at implantation energy of 60 KeV and impurity concentration of $2\times10^{13}$ cm$^{-2}$ using the side wall assist films 5' and 7' and the refractory metal gate 3 as a mask, thereby producing n$^+$ type high dopant concentration active layers 8a and 8b at asymmetrical positions at left and right with respect to the gate 3.

Figure 1I:
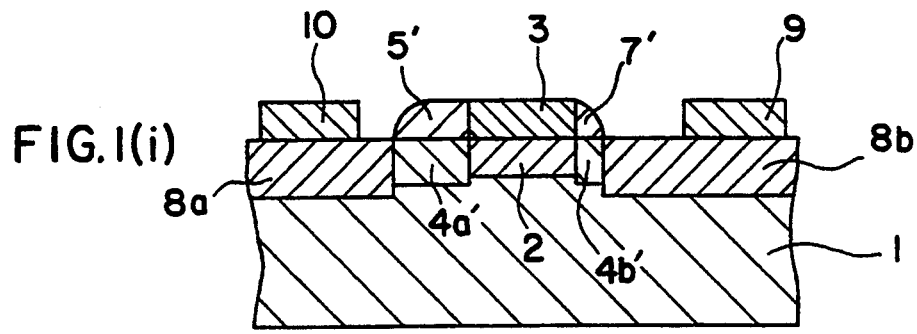

After at 800° C. for 30 minutes, and as shown in FIG. 1(i), a source electrode 9 comprising Ni/Ge/Au is deposited on the n$^+$ type high dopant concentration active layer 8b at the side where the side wall assist film 7' is disposed and at the same time a drain electrode 10 is deposited on the n$^+$ type high dopant concentration active layer 8a at the opposite side of the gate by deposition and lift-off, thereby completing a field effect transistor.

The advantages of the present invention over the above-described the prior art will be described.

First of all, influences on the transistor characteristics from the precision of the pattern production will be described.

Figure 2A:
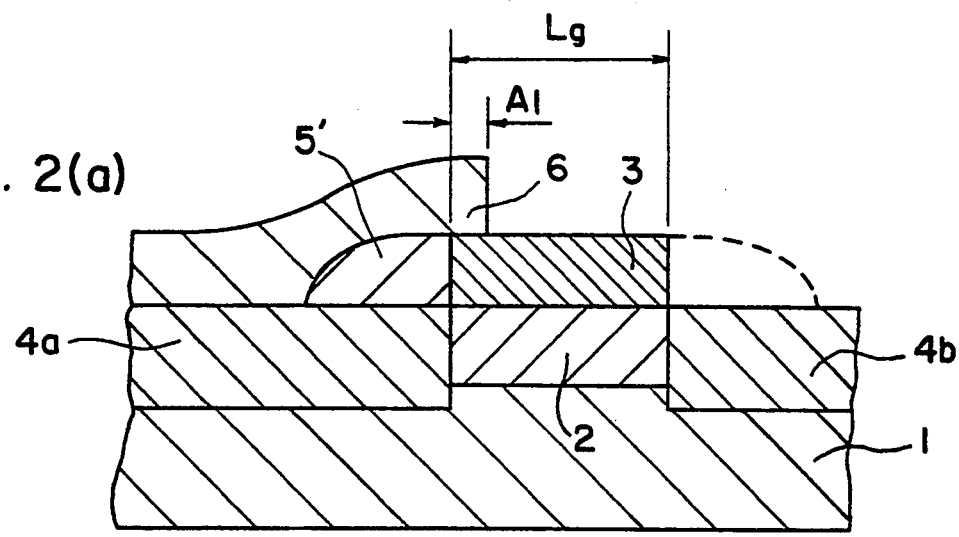
FIGS. 2(a) and 2(b) are diagrams for explaining the precision of patterning in the first embodiment.
Figure 2B:
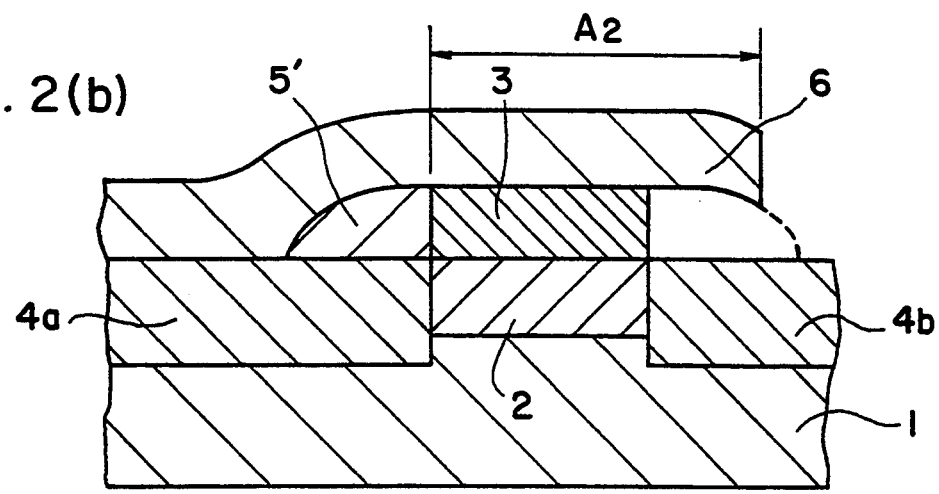
Figure 4A:
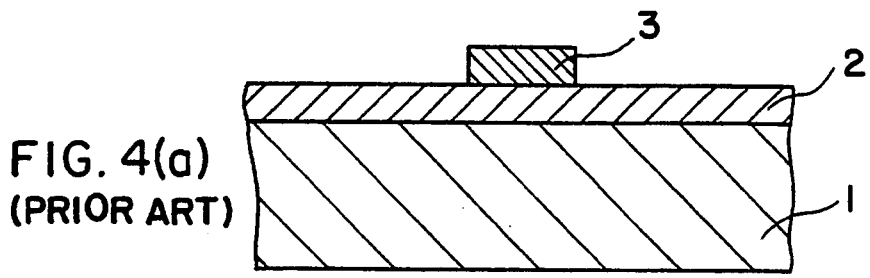
FIGS. 4(a) to 4(d) are cross-sectional side views of the major process steps of a production method for a semiconductor device according to the prior art.
Figure 4B:
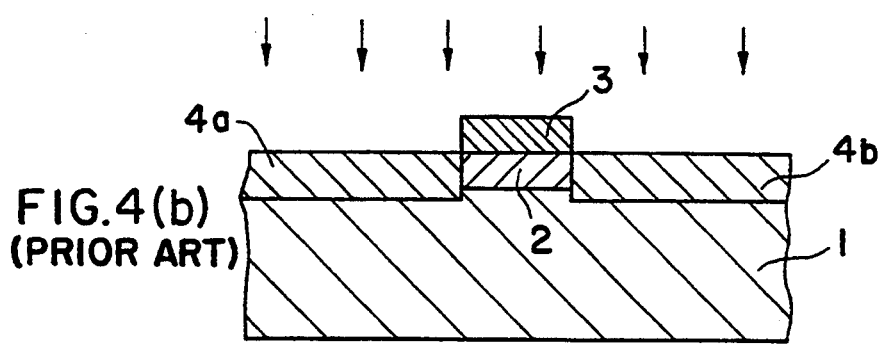
Figure 4C:
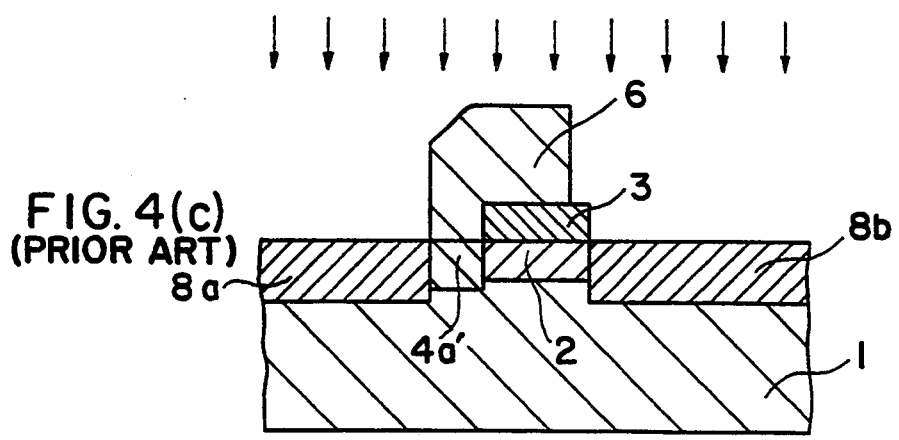
Figure 4D:
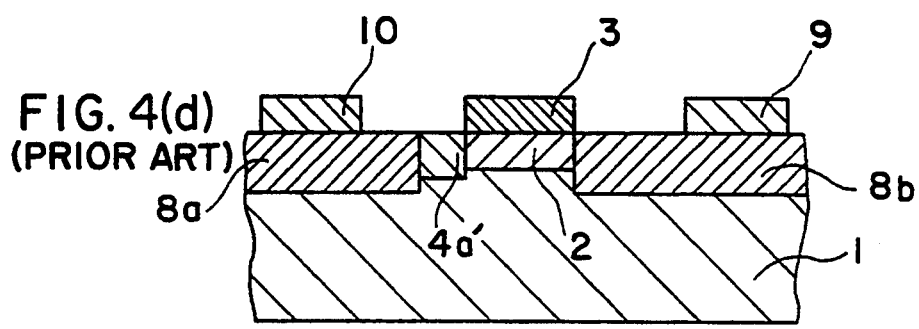
Figure 5A:
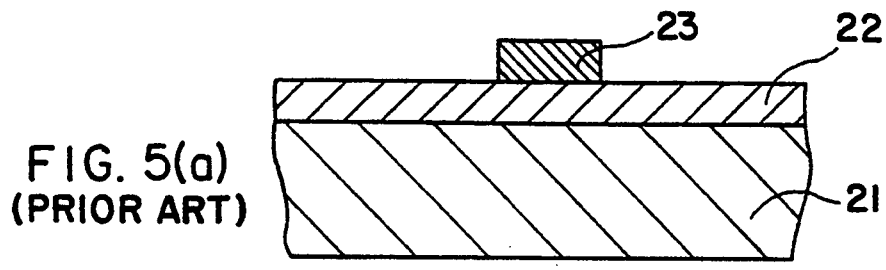
FIGS. 5(a) to 5(e) are cross-sectional side views of major process steps of a production method for a semiconductor device according to the prior art.
Figure 5B:
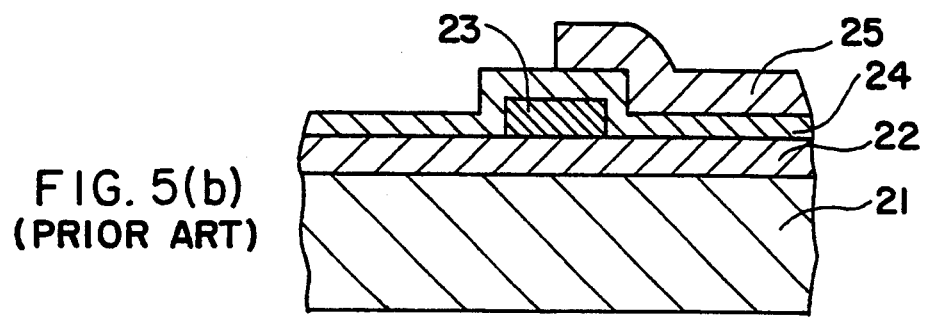
Figure 5C:
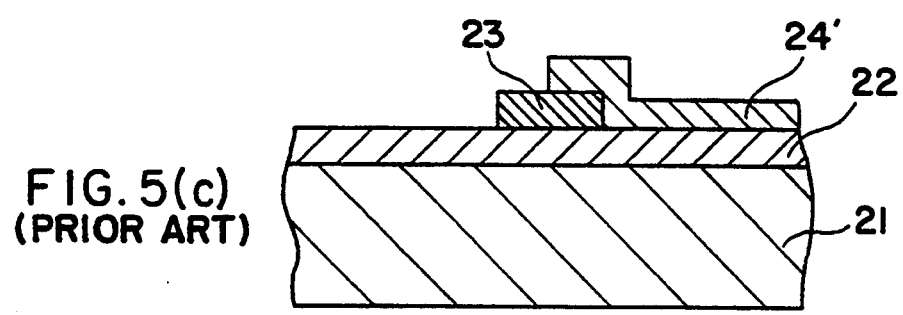
Figure 5D:
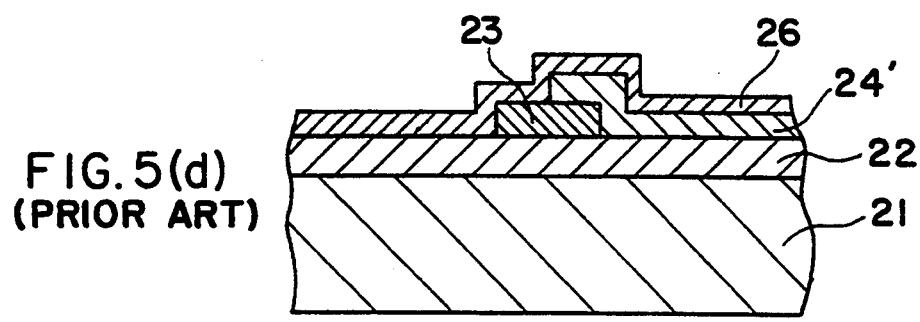
Figure 5E:
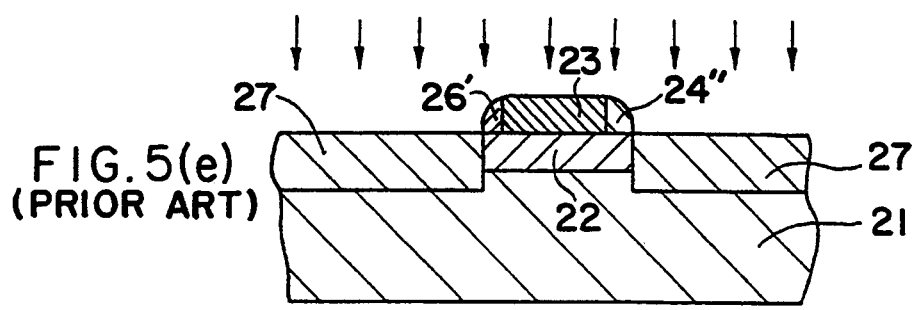
Figure 6:
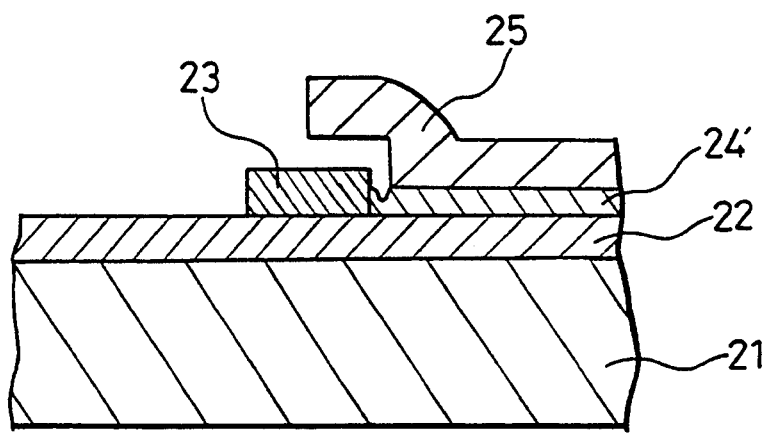
FIG. 6, FIG. 7, and FIGS. 8(a) to 8(c) are diagrams for explaining the problems in the processes of FIGS. 5(a) to 5(e).
Figure 7:
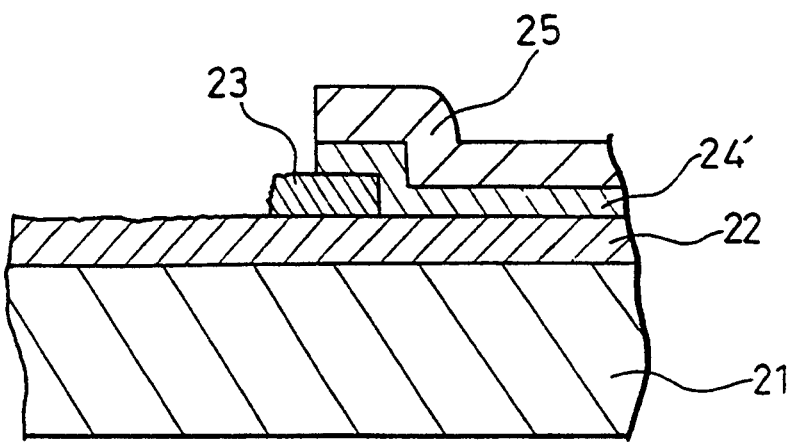
Figure 8A:
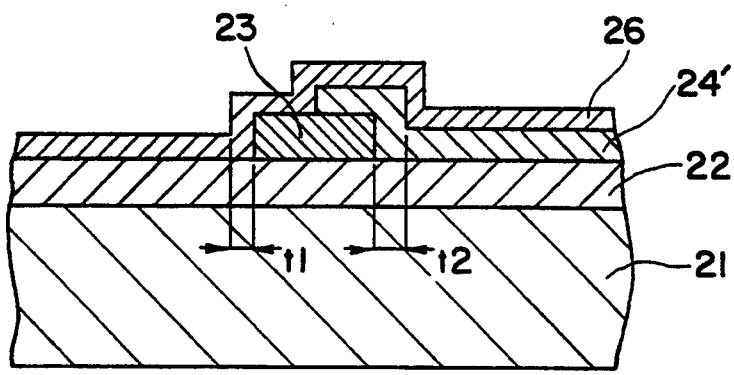
Figure 8B:
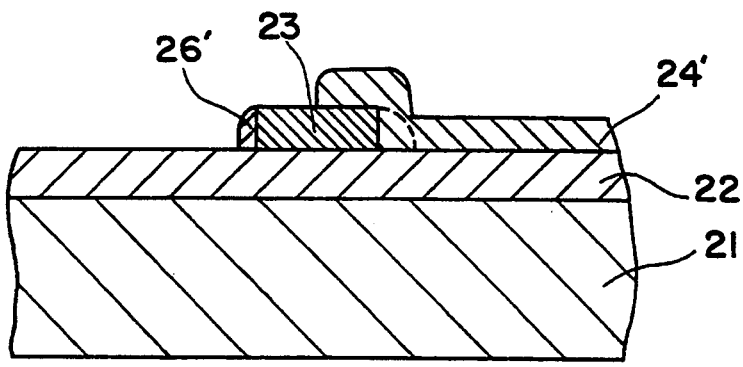
Figure 8C:
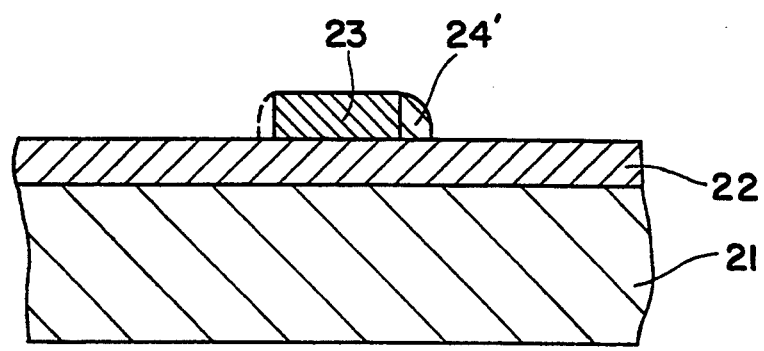

As shown in FIG. 4(c), the distance between the gate 3 and the n$^+$ type high concentration active layer 8a at the drain side is determined by the precision of the pattern alignment of the photoresist 6. To the contrary, in the present invention, as shown in FIGS. 2(a) and 2(b), the photoresist 6 need only be patterned such that the end surface comes to the position up to $A_1 \sim A_2$ from the end of the gate 3 to cover the side wall assist film 5' at the side where a drain electrode is to be produced. As long as the end surface of the photoresist is held in this range, the result of the etching of the side wall assist films 5' at the side where a source electrode is to be produced is the same.

Herein, the value of $A_1$ is required to be sufficient so that the side wall assist film 5' at the side where a drain electrode is to be produced is not eroded by permeation of the buffered hydrofluoric acid into the interface between the photoresist 6 and the refractory metal gate 3 when the device is etched in buffered fluoric hydrofluoric acid. In the experiment, 0.3 micron is was obtained for $A_1$. Therefore, this method can be applied to a case where the gate length Lg is larger than 0.3 microns.

Furthermore, the value of $A_2$ is only required to be sufficient so that the photoresist 6 does not cover the side wall assist film 5' which is to be etched. Furthermore, since the side wall assist film 5' at the drain side is completely protected by the photoresist 6 and the gate 3 when the side wall assist film 5' at the source side is removed by etching, there is no problem of side etching as in the prior art, and the side wall assist film 5' can remain with one side of the gate 3 at high controllability and high reproducibility.

As for the film thickness of the photoresist 6, in the prior art shown in FIG. 4(c), in order to make the photoresist 6 function as a mask for ion implantation of the n$^+$ type high dopant concentration active layer, a film thickness larger than the range of ions is required. For example, when $^{29}Si^+$ ions are implanted at 60 KeV, a photoresist having a film thickness of about 5000 angstroms is required, and a photoresist 16 having a film thickness of about 1 micron is actually used. To the contrary, in the invention, the photoresist is only required to have a thickness capable of resisting etching by hydrofluoric acid. Generally, the etching rate of photoresist by the buffered hydrofluoric acid (mixture of buffer solution and hydrogen fluoride in a ratio of 6:1) is several tens of A/min, and can be ignored in practical use. Therefore, in this embodiment, the photoresist film thickness is only required to be about 1000 angstroms compared to about 1 micron in the prior art. The fact that such a thin photoresist can be used results in high resolution. Thus, the present invention is advantageous for patterning.

Furthermore, in this embodiment, as shown in FIGS. 1(f) to 1(g), in the process of producing insulating films asymmetrical configurations at the left and right side walls of gate 3 by etching, since the film thicknesses of the insulating film 7 are equal to each other at the both sides of the gate 3, the times required for equal etching of the two insulating films 7 are equal to each other at the left and right sides of the gate, thereby producing side wall assist films 5' and 7' with controllability and reproducibility.

The above-described photoresist may be any type of photosensitive resin. For example, photosensitive polyimide may be used.

The controllability of the width $d_1$ and $d_2$ of the side wall assist films 5' and 7' shown in FIGS. 1(d) and 1(g) will be described. The widths $d_1$ and $d_2$ can be controlled by varying the thicknesses of the first insulating film 5 and the second insulating film 7 which are deposited in the processes shown in FIGS. 1(c) and 1(f), respectively. FIG. 3 shows the relationship between the thickness of the insulating film and the width of the side wall assist film when the over etching of 30% is carried out. As seen from the figure, the width of the side wall assist film is directly proportional to the thickness of the insulating film, and this means that the widths $d_1$ and $d_2$ can be determined with very high controllability. Accordingly, $d_1$ and $d_2$ may be determined in accordance with the required breakdown voltage between the gate and the drain and that between the gate and the source. For example, in a case where $d_1$ is 5000 angstroms as shown in the above-described embodiment, the gate-drain breakdown voltage is 20 V, while in a case where $d_2$ is 2000 angstroms, the gate-source breakdown voltage is about 7 V. This high controllability of $d_1$ and $d_2$ produces a stable mutual conductance $g_m$, thereby producing a high performance transistor with high precision.

While in the above-illustrated embodiment a semi-insulating GaAs substrate is used, the present invention may be applied to a field effect transistor using other compound semiconductors with the same effects as described above.

While in the above-illustrated embodiment the first insulating film 5 and the second insulating film 7 comprise $SiO_x$, the insulating films are not restricted thereto. The insulating film need only be produced in the configurations shown in FIG. 1(c) or (f) by plasma CVD. For example, SiN and AlN may be used.

While in the above-illustrated embodiment the side wall assist films 5' and 7' remain after the ion implantation, these side wall assist films may be removed by hydrofluoric acid after the ion implantation process.

While in the above-illustrated embodiment the intermediate dopant concentration active layers 4a' and 4b' are produced below the side wall assist films 5' and 7' thereby to produce an LDD structure field effect transistor, the present invention is not be restricted to this structure. That is, the process of FIG. 1(b) may be removed, and high dopant concentration active regions 8a and 8b may be produced directly without providing intermediate dopant concentration active layers.

As is evident from the foregoing description, according to the present invention, side wall assist films are produced at both side walls of a refractory metal gate in asymmetrical configurations, and high concentration active layers are self-alignedly produced at asymmetrical positions at the respective sides of the gate by ion implantation using the side walls as a mask. Therefore, variations in the gate-drain breakdown voltage and the source-gate breakdown voltage and variations in transistor performance can be reduced, thereby producing a field effect transistor having a stable transistor breakdown voltage and stable performance with high precision and high reproducibility.

What is claimed is:

1. A Schottky barrier gate field effect transistor comprising:
   a compound semiconductor substrate having a surface;
   a refractory metal gate electrode disposed on the surface of said substrate forming a Schottky barrier with said substrate;
   a relatively low dopant concentration active region disposed in said substrate adjacent a part of the surface of said substrate contacting said gate electrode;
   first and second relatively high dopant concentration regions disposed in said substrate adjacent parts of the surface of said substrate on opposite sides of said relatively low dopant concentration active region;
   first and second asymmetrical intermediate dopant concentration regions disposed in said substrate adjacent respective parts of the surface of said substrate, said first intermediate dopant concentration region being disposed between and contacting said relatively low dopant concentration active region and said first relatively high dopant concentration region, and said second intermediate dopant concentration active region being disposed between and contacting said relatively low dopant concentration active region and said second relatively high dopant concentration region wherein said first intermediate dopant concentration region is longer, measured along the surface of said substrate, than said second intermediate dopant concentration region whereby said first and second relatively high dopant concentration regions are asymmetrically disposed within said substrate relative to said relatively low dopant concentration active region;
   a drain electrode disposed on the surface of said substrate opposite and contacting said first relatively high dopant concentration region; and
   a source electrode disposed on the surface of said substrate opposite and contacting said second relatively high dopant concentration region.

2. The Schottky barrier gate field effect transistor of claim 1 wherein said gate electrode includes first and second side wall surfaces transverse to the surface of said substrate and including asymmetrical first and second side wall assist films disposed on the surface of said substrate contacting the first and second side wall surfaces of said gate electrode, respectively, and said first and second intermediate dopant concentration regions, respectively, said first side wall assist film being longer, measured along the surface of said substrate, than said second side wall assist film wherein said side wall assist films are selected from the group consisting of $SiO_x$, SiN, and AlN.

* * * * *